(12) United States Patent
Takenaga et al.

(10) Patent No.: US 9,798,317 B2
(45) Date of Patent: Oct. 24, 2017

(54) SUBSTRATE PROCESSING METHOD AND CONTROL APPARATUS

(71) Applicant: Tokyo Electron Limited, Tokyo (JP)

(72) Inventors: Yuichi Takenaga, Iwate (JP); Katsuhiko Komori, Yamanashi (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 14/321,029

(22) Filed: Jul. 1, 2014

(65) Prior Publication Data

US 2015/0011091 A1  Jan. 8, 2015

(30) Foreign Application Priority Data

Jul. 3, 2013 (JP) ................................. 2013-140155
Jul. 9, 2013 (JP) ................................. 2013-143956

(51) Int. Cl.

| | |
|---|---|
| *H01L 21/302* | (2006.01) |
| *H01L 21/461* | (2006.01) |
| *H01B 13/00* | (2006.01) |
| *B44C 1/22* | (2006.01) |
| *C03C 15/00* | (2006.01) |
| *C03C 25/68* | (2006.01) |

(Continued)

(52) U.S. Cl.
CPC .......... *G05B 19/418* (2013.01); *C23C 16/045* (2013.01); *H01L 21/32136* (2013.01); *H01L 21/76825* (2013.01); *H01L 21/76862* (2013.01); *H01L 21/02164* (2013.01); *H01L 21/02271* (2013.01)

(58) Field of Classification Search
None
See application file for complete search history.

(56) References Cited

U.S. PATENT DOCUMENTS 5,217,501 A * 6/1993 Fuse ....................... C23C 16/54
                                                              118/50.1
6,030,881 A * 2/2000 Papasouliotis ........ C23C 16/045
                                                              257/E21.546

(Continued)

FOREIGN PATENT DOCUMENTS

| JP | 2007-305981 A | 11/2007 |
|---|---|---|
| JP | 2008-214719 A | 9/2008 |

(Continued)

*Primary Examiner* — Stephanie Duclair
(74) *Attorney, Agent, or Firm* — Abelman, Frayne & Schwab

(57) ABSTRACT

Provided is a substrate processing method of filling a recess of a predetermined uneven pattern formed on a substrate with a film forming material by performing a first film forming processing, a first etching processing and a second film forming processing on the substrate, using a vertical substrate processing apparatus and a control apparatus controlling operations of the vertical substrate processing apparatus. The method includes calculating a first film forming condition, a first etching condition, and a second film forming condition by the control apparatus such that the film forming material is filled in the recess without any void after the second film forming processing; and performing the first film forming processing, the first etching processing and the second film forming processing on the substrate based on the calculated first film forming condition, first etching condition and second film forming condition.

3 Claims, 4 Drawing Sheets

(51) Int. Cl.
*C23F 1/00* (2006.01)
*G05B 19/418* (2006.01)
*H01L 21/768* (2006.01)
*H01L 21/3213* (2006.01)
*C23C 16/04* (2006.01)
*H01L 21/02* (2006.01)

(56) References Cited

U.S. PATENT DOCUMENTS

2011/0256726 A1* 10/2011 LaVoie .................. C23C 16/045
  438/702
2012/0267341 A1* 10/2012 Kato ................. H01L 21/02164
  216/37

FOREIGN PATENT DOCUMENTS

| | | | |
|---|---|---|---|
| JP | 2012-199306 A | 10/2012 | |
| JP | 2012-209394 A | 10/2012 | |
| KR | 10-2011-0218145 A | 11/2011 | |
| KR | 10-2012-0106650 A | 9/2012 | |

\* cited by examiner

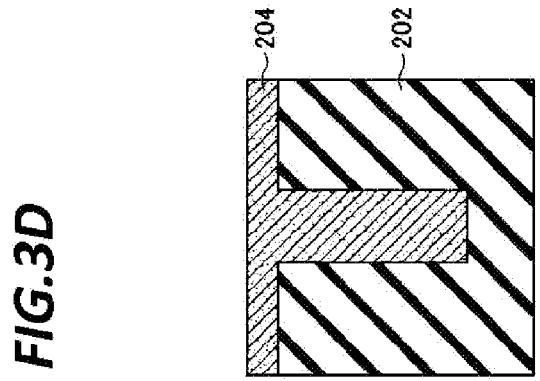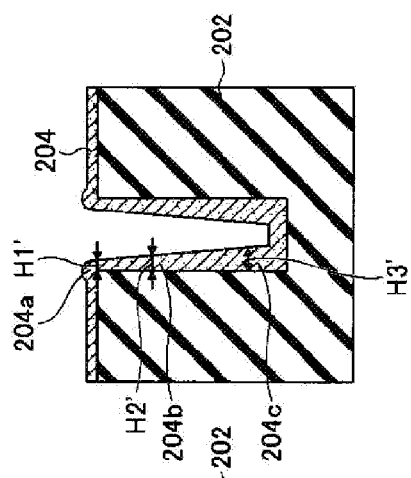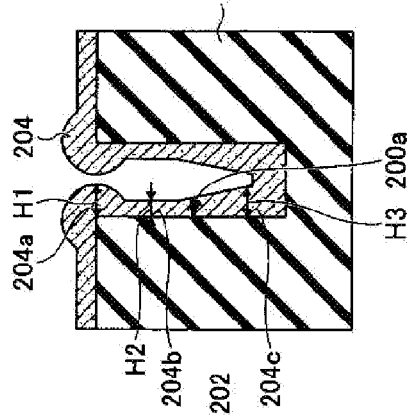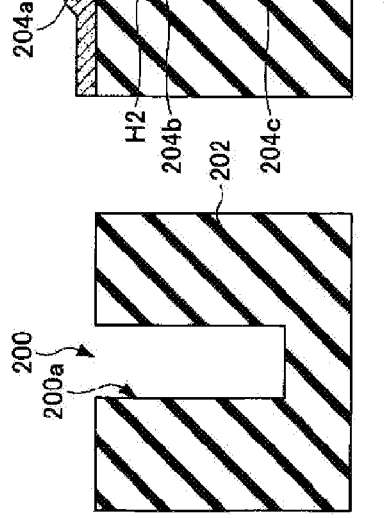

SUBSTRATE PROCESSING METHOD AND CONTROL APPARATUS

CROSS-REFERENCE TO RELATED APPLICATIONS

This application is based on and claims priority from Japanese Patent Application Nos. 2013-140155 and 2013-143956, filed on Jul. 3, 2013 and Jul. 9, 2013 with the Japan Patent Office, the disclosures of which are incorporated herein in their entirety by reference.

TECHNICAL FIELD

The present disclosure relates to a substrate processing method and a control apparatus.

BACKGROUND

In manufacturing semiconductor devices, various processings, such as a film forming processing and an etching processing, are performed repeatedly on semiconductor wafers (hereinafter, referred to as wafers) serving as workpieces to manufacture desired devices.

For example, in a film forming processing on wafers, a holder configured to hold a plurality of wafers in a shelf form is disposed in a vertical heat treatment apparatus (hereinafter, referred to as a vertical substrate processing apparatus), and a film is formed on the wafers by, for example, a chemical vapor deposition (CVD) processing and an oxidation processing.

Conventionally, a (dry) etching has been performed on the films formed on wafers one by one using, for example, a parallel-plate plasma processing apparatus. However, from the viewpoint of improvement in throughput, there has recently been suggested a process in which a film forming processing and an etching processing are both performed in a vertical substrate processing apparatus. Specifically, there has been suggested a deposition etch deposition (DED) process in which a first film forming processing, an etching processing and a second film forming processing are sequentially performed on a wafer formed with patterns such as trenches and holes in a vertical substrate processing apparatus so as to fill recesses of the patterns with a film forming material (e.g., Japanese Patent Laid-Open Publication No. 2012-209394).

Since a film forming processing and an etching processing are performed in the vertical substrate processing apparatus, a plurality of wafers may be subjected simultaneously to the film forming processing and then, the etching processing. Accordingly, it is considered that the throughput may be enhanced.

SUMMARY

According to an aspect, the present disclosure provides a substrate processing method of filling a recess of a predetermined uneven pattern formed on a substrate with a film forming material by performing a first film forming processing, a first etching processing and a second film forming processing on the substrate, using a vertical substrate processing apparatus including a processing container capable of disposing a substrate holder configured to hold a plurality of substrates in multi-tiers at predetermined intervals, a heater configured to heat an inside of the processing container, a processing gas inlet configured to introduce a film forming gas and an etching gas into the processing container and an exhaust unit configured to exhaust an atmosphere in the processing container, and a control apparatus controlling operations of the vertical substrate processing apparatus. The method includes calculating a first film forming condition including a first film formation time of the first film forming processing, a first etching condition including a first etching time of the first etching processing, and a second film forming condition including a second film formation time of the second film forming processing by the control apparatus such that the film forming material is filled in the recess without any void after the second film forming processing; and performing the first film forming processing, the first etching processing and the second film forming processing on the substrate based on the calculated first film forming condition, first etching condition and second film forming condition.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

FIGS. 3A to 3D are schematic views illustrating an example of a DED process according to the present exemplary embodiment.

DETAILED DESCRIPTION

Figure 1:
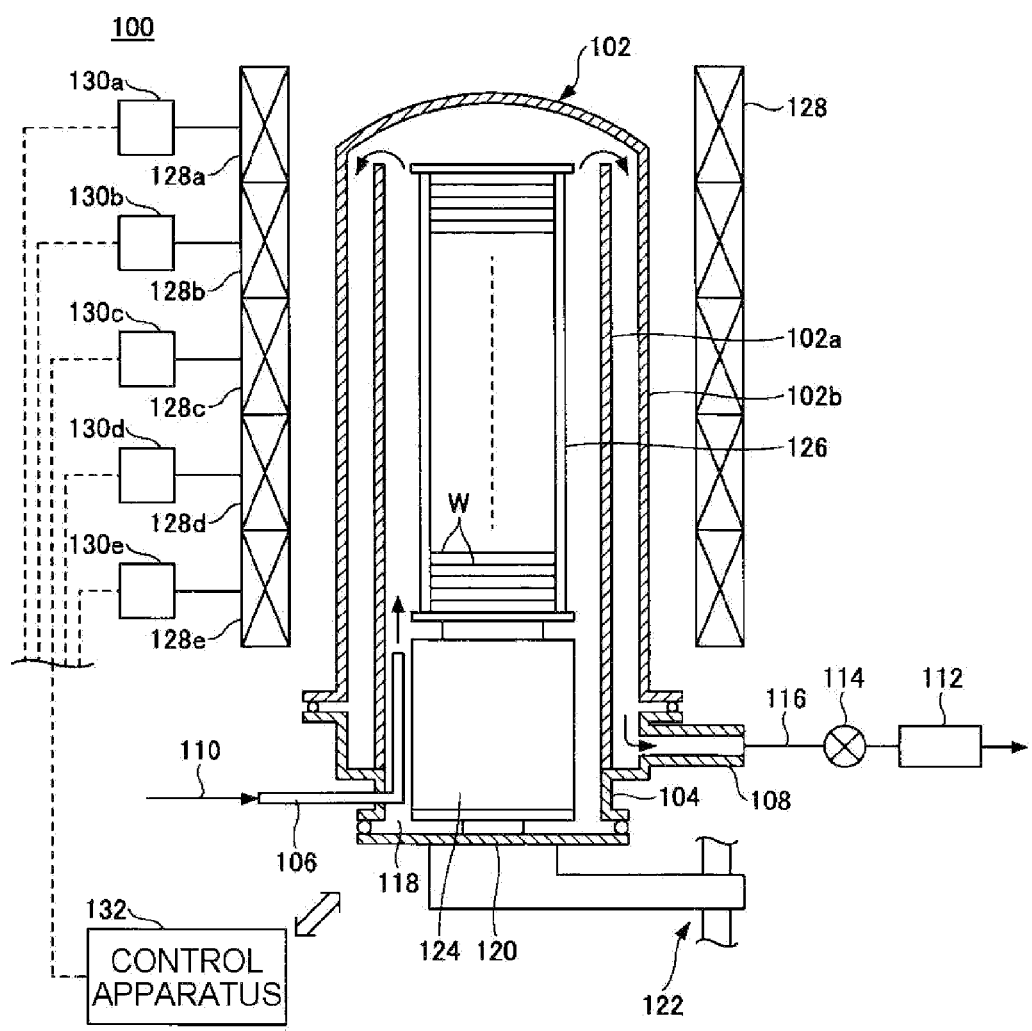
FIG. 1 is a schematic view illustrating an example of a vertical substrate processing apparatus according to the present exemplary embodiment.

In the following detailed description, reference is made to the accompanying drawing, which form a part hereof. The illustrative embodiments described in the detailed description, drawing, and claims are not meant to be limiting. Other embodiments may be utilized, and other changes may be made, without departing from the spirit or scope of the subject matter presented here.

With a recent demand for high speed of semiconductor devices, miniaturization of wiring patterns, and high integration, the trench width or the hole diameter becomes tens of nm or less. When a film forming material is deposited in a pattern of such narrow trenches or holes, overhang is likely to occur, in which an opening of the pattern is blocked by the film forming material. If a next film forming processing is performed in a state where the opening width of the pattern is narrowed by generation of overhang, the film forming material is unable to be sufficiently filled inside the pattern, resulting in generation of void (cavity). In order to fill a pattern on a wafer with the film forming material without any void, using the DED process in the vertical substrate processing apparatus, control of a film formation amount and an etching amount is important in the film forming processing and the etching processing.

In order to solve the problem, the present disclosure provides a substrate processing method in which a film forming material is filled without any void in the DED process in the vertical substrate processing apparatus.

According to an aspect, the present disclosure provides a substrate processing method of filling a recess of a predetermined uneven pattern formed on a substrate with a film forming material by performing a first film forming processing, a first etching processing and a second film forming processing on the substrate, using a vertical substrate processing apparatus including a processing container capable of disposing a substrate holder configured to hold a plurality of substrates in multi-tiers at predetermined intervals, a heater configured to heat an inside of the processing container, a processing gas inlet configured to introduce a film forming gas and an etching gas into the processing container and an exhaust unit configured to exhaust an atmosphere in the processing container, and a control apparatus controlling operations of the vertical substrate processing apparatus. The method includes calculating a first film forming condition including a first film formation time of the first film forming processing, a first etching condition including a first etching time of the first etching processing, and a second film forming condition including a second film formation time of the second film forming processing by the control apparatus such that the film forming material is filled in the recess without any void after the second film forming processing; and performing the first film forming processing, the first etching processing and the second film forming processing on the substrate based on the calculated first film forming condition, first etching condition and second film forming condition.

In the above-described substrate processing method, the calculating is performed by the control apparatus based on a relationship between the first film formation time and a film formation amount, a relationship between the first etching time and an etching amount, and a relationship between the second film formation time and a film formation amount at a first position near an opening of the pattern, a second position near a bottom of the pattern, and a third position between the first position and the second position, respectively, with respect to a depth direction of the pattern.

In the above-described substrate processing method, the first etching condition is a condition that an etching amount at the first position is greater than etching amounts at the second position and the third position.

In the above-described substrate processing method, the first film forming condition includes a film formation temperature, a flow rate of the film forming gas, and a pressure in the processing container, the first etching condition includes an etching temperature, a flow rate of the etching gas, and a pressure in the processing container, and the second film forming condition includes a film formation temperature, a flow rate of the film forming gas, and a pressure in the processing container.

According to another aspect, the present disclosure provides a substrate processing method of filling a recess of a predetermined uneven pattern formed on a substrate with a film forming material by repeating a first film forming processing and an etching processing a predetermined number of times and then performing a second film forming processing on the substrate, using a vertical substrate processing apparatus including a processing container capable of disposing a substrate holder configured to hold a plurality of substrates in multi-tiers at predetermined intervals, a heater configured to heat an inside of the processing container, a processing gas inlet configured to introduce a film forming gas and an etching gas into the processing container and an exhaust unit configured to exhaust an atmosphere in the processing container, and a control apparatus controlling operations of the vertical substrate processing apparatus. The method includes calculating a film forming condition including a film formation time in each film forming processing, and an etching condition including an etching time in each etching processing by the control apparatus such that the film forming material is filled in the recess without any void after the second film forming processing; and performing each forming processing and each etching processing on the substrate based on each of the calculated film forming condition and etching condition.

According to still aspect, the present disclosure provides a control apparatus capable of controlling operations of a vertical substrate processing apparatus which fills a recess of a predetermined uneven pattern formed on a substrate with a film forming material by performing a first film forming processing of the film forming material, an etching processing of the film forming material, and a second film forming processing of the film forming material on the substrate, the vertical substrate processing apparatus including a processing container capable of disposing a substrate holder configured to hold a plurality of substrates in multi-tiers at predetermined intervals, a heater configured to heat an inside of the processing container, a processing gas inlet configured to introduce a film forming gas and an etching gas into the processing container and an exhaust unit configured to exhaust an atmosphere in the processing container. The control apparatus is provided with a model storage unit. The model storage unit stores a processing time-film thickness model which expresses an influence of a processing time including a combination of a first supply time when the film forming gas in the first film forming processing is supplied, a second supply time when the film forming gas in the etching processing is supplied, and a third supply time when the film forming gas in the second processing is supplied, on the film thickness of the film forming material on the substrate.

In the above-described control apparatus, the model storage unit further stores a first process model which expresses an influence of a temperature of the substrate on a film formation amount of the film forming material; a second process model which expresses an influence of a flow rate of the film forming gas on the film formation amount of the film forming material; a third process model which expresses an influence of a pressure in the processing container on the film formation amount of the film forming material; and a thermal model which expresses a relationship between the temperature of the substrate and a setting temperature of the heater.

In the above-described control apparatus, the model storage unit further stores a fourth process model which expresses an influence of the temperature of the substrate on an etching amount of the film forming material; a fifth process model which expresses an influence of a flow rate of the etching gas on the etching amount of the film forming material; and a sixth process model which expresses of an influence of the pressure of the processing container on the etching amount of the film forming material.

According to the present disclosure, it is possible to provide a substrate processing method in which a film forming material is filled without any void in the DED process in the vertical substrate processing apparatus.

Hereinafter, exemplary embodiments of the present disclosure will be described with reference to the drawings attached herewith.

(Vertical Substrate Processing Apparatus)

A vertical substrate processing apparatus according to the present exemplary embodiment will be described. The vertical heat treatment apparatus of the present exemplary embodiment is a substrate processing apparatus in which a holder configured to hold a plurality of, for example, semiconductor wafers serving as workpieces in multi-tiers may be disposed and a film forming processing and an etching processing on the plurality of semiconductor wafers may be performed at the same time.

FIG. 1 is a schematic view illustrating an example of a vertical substrate processing apparatus according to the present exemplary embodiment.

The vertical substrate processing apparatus 100 according to the present exemplary embodiment includes a processing chamber 102 made of, for example, quartz, in which the longitudinal direction of the processing chamber 102 is the vertical direction. For example, the processing chamber 102 is configured as a double pipe structure having a cylindrical inner tub 102a, and an outer tub 102b which is provided with a ceiling and disposed concentrically outside the inner tub 102a.

The lower portion of the processing chamber 102 is held hermetically by a manifold 104 made of, for example, stainless steel. The manifold 104 may be fixed to a base plate (not illustrated).

The manifold 104 is provided with a gas introduction unit 106 configured to introduce a processing gas including one or more film forming gases for a film forming processing or one or more etching gases for an etching processing, or a purge gas such as an inert gas (e.g., $N_2$ gas) into the processing chamber 102. Although only one gas introduction unit 106 is illustrated in FIG. 1, the present disclosure is not limited thereto. For example, three gas introduction units 106 are preferably disposed in the upper portion, middle portion and lower portion in a height direction of a wafer boat 126 to be described later. By providing a plurality of gas introduction units 106, it is possible to enhance an inter-plane uniformity of semiconductor wafers W (hereinafter, referred to as a wafer W) in a film forming processing or an etching processing. That is, one or more gas introduction units 106 may be provided depending on, for example, the number of wafers W, the kind of processing gases to be used, and desired process conditions.

The kind of processing gases is not particularly limited. For example, in a case where polycrystalline silicon (polysilicon) serving as a gate electrode is filled in a wafer W in which trenches or holes are formed in advance, using a chemical vapor deposition (CVD), for example, a monosilane ($SiH_4$) gas is thermally decomposed under a nitrogen ($N_2$) gas or a hydrogen ($H_2$) gas atmosphere. Further, in a case where a silicon oxide film serving as an insulation film is filled in a wafer W in which trenches or holes are formed in advance, the silicon oxide film is evaporated using a $SiH_4$ gas or an oxygen ($O_2$) gas. That is, the processing gas may be selected suitably depending on a desired process. Further, the etching gas may also be selected suitably depending on the kind of films to be formed.

The gas introduction pipe 106 is connected with a pipe 110 in order to introduce various gases as described above into the processing chamber 102. In the pipe 110, a flow rate adjusting unit such as a mass flow controller (not illustrated) or a valve (not illustrated) is interposed in order to adjust each gas flow rate.

Further, the manifold 104 is provided with a gas exhaust unit 108 configured to exhaust the inside of the processing chamber 102. The gas exhaust unit 108 is connected with a pipe 116 serving as a vacuum exhaust path, which is provided with a vacuum pump 112 or an opening variable valve 114 configured to controllably decompress the inside of the processing chamber 102.

A furnace throat 118 is formed in the lower portion of the manifold 104. The furnace throat 118 is provided with a disc-shaped cover 120 made of, for example, stainless steel. The cover 120 is movable up and down by an elevation mechanism 122 so as to seal the furnace throat 118.

A thermos 124 made of, for example, quartz is provided above the cover 120. In addition, above the thermos 124, a wafer boat 126 made of, for example, quartz is disposed to hold, for example, about 25 to 150 sheets of wafers W horizontally in multi-tiers at predetermined intervals.

The wafer boat 126 is carried into the processing chamber 102 by moving up the cover 120 using the elevation mechanism 122, and the wafers W held in the wafer boat 126 are subjected to various processings. Further, after various processings are performed, the wafer boat 126 is carried out from the inside of the processing chamber 102 to a loading area below the processing chamber 102 by moving down the cover 120 using the elevation mechanism 122.

Further, a cylindrical heater 128 is installed around an outer periphery of the processing chamber 102 so as to heat the processing chamber 102 to a predetermined temperature.

The heater 128 is desirably divided into a plurality of zones, that is, heaters 128a to 128e which are provided downwardly from the upper side in the vertical direction in the example illustrated in FIG. 1. The heaters 128a to 128e are configured to independently control a heat generation amount by power controllers 130a to 130e, respectively. Further, on the inner wall of the inner tub 102a and/or the outer wall of the outer tub 102b, temperature sensors (not illustrated) are provided to correspond to the heaters 128a to 128e. Meanwhile, the number of divisions of the heater 128 is not limited to the example as illustrated in FIG. 1. For example, the heater 128 may be dived into three zones, which are provided downwardly from the upper side in the vertical direction.

The plurality of wafers W placed in the wafer boat 126 constitute one batch and are subjected to a film forming processing or an etching processing at the same time. At this time, at least one of the wafers W placed in the wafer boat 126 is preferably a monitor wafer. The monitor wafer is preferably placed to correspond to each of the divided heaters 128a to 128e, but may not be placed to correspond to each of them. For example, ten sheets of monitor wafers may be placed in the five zones, or three monitor wafers may be placed.

Further, the vertical substrate processing apparatus 100 according to the present exemplary embodiment includes a control apparatus 132 inside or outside of the vertical substrate processing apparatus 100. In a case where the control apparatus 132 is provided outside, the control apparatus 132 may control the vertical substrate processing apparatus 100 by a wired or wireless communication unit.

Figure 2:
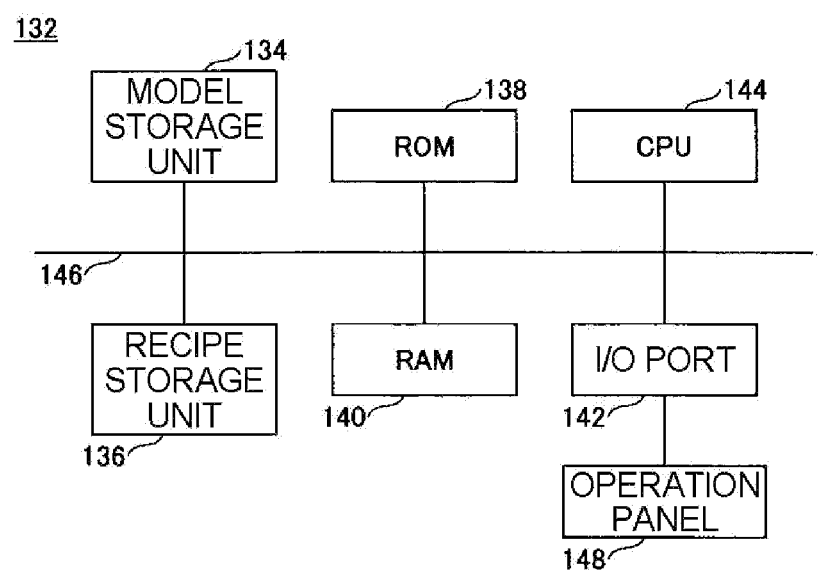
FIG. 2 is a schematic view illustrating an example of a control apparatus according to the present exemplary embodiment.

FIG. 2 is a schematic view illustrating an example of the control apparatus 132 according to the present exemplary embodiment.

As illustrated in FIG. 2, the control apparatus 132 includes a model storage unit 134, a recipe storage unit 136, a read-only memory (ROM) 138, a random access memory (RAM) 140, an I/O port 142, a central processing unit (CPU) 144, and a bus 146 configured to connect these components to each other.

The model storage unit 134 stores at least process models as described below. Further, the model storage unit 134 preferably stores a thermal model as described below.

The recipe storage unit 136 stores a process recipe that defines a control procedure depending on the kind of the etching processing or the film forming processing to be performed by the vertical substrate processing apparatus 100. The process recipe is a recipe prepared for every processing to be performed in practice by a user, and defines processing conditions such as, for example, a change in pressure, a change in temperature, timing of start or stop of supplying processing gases, and supply amounts of the processing gases from the carry-in of the wafers W to the vertical substrate processing apparatus 100 to the carry-out of the processed wafers W. Then, the recipe is updated based on processing conditions calculated from the process models as described above.

The ROM 138 is a storage medium that is constituted with, for example, an electrically erasable programmable read-only memory (EEPROM), a flash memory and a hard disc, and stores, for example, an operation program of the CPU 144.

The RAM 140 functions as a work area for the CPU 144.

The I/O port 142 supplies measurement signals for processing conditions, such as temperature, pressure and flow rates of the processing gases, to the CPU 144, and outputs control signals output by the CPU 144 to each unit (e.g., a controller (not illustrated) of the opening variable valve 114, the power controller 130, a mass flow controller (not illustrated) connected to the gas introduction unit 106, and a temperature sensor (not illustrated) disposed on the inner wall of the inner tub 102a). Further, the I/O port 142 is connected with an operation panel 148 through which a user operates the vertical substrate processing apparatus 100.

The CPU 144 executes the operation program stored in the ROM 138. According to the instructions from the operation panel 148, the CPU 144 controls the operations of the vertical substrate processing apparatus 100 according to the process recipe stored in the recipe storage unit 136.

The bus 146 transmits information between the units.

(Substrate Processing Method)

[Outline of Substrate Processing Method]

Referring to the drawings, descriptions will be made on a substrate processing method by the DED process, using the vertical substrate processing apparatus 100 as described above.

FIGS. 3A to 3D are schematic views illustrating an example of a DED process according to the present exemplary embodiment. In FIGS. 3A to 3D, descriptions will be made on a process in which a film forming processing and an etching processing are performed repeatedly on a wafer W having a base film 202 formed with a pattern 200 such as a trench or hole to fill the pattern 200 with a film forming material 204. In the example of FIGS. 3A to 3D, the film forming material 204 is filled in the pattern 200 by sequentially performing a film forming processing, an etching processing and a film forming processing. However, the film forming material 204 may be filled by further performing the etching processing and the film forming processing once or more times.

First, as illustrated in FIG. 3A, a plurality of wafers W, each of which has a base film 202 formed with a pattern 200 such as a trench or hole, is carried into the vertical substrate processing apparatus 100 through a wafer boat 126.

Then, as illustrated in FIG. 3B, the film forming material 204 is deposited at least on the pattern 200 in accordance with a predetermined film forming condition including at least a film formation time (e.g., a film formation time t1 in the film forming processing from the step of FIG. 3A to the step of FIG. 3B). Accordingly, as illustrated in FIG. 3B, in the depth direction of the pattern 200, a film thickness of a film forming material 204a corresponding to an "upper portion" near an opening becomes H1, a film thickness of a film forming material 204c corresponding to a "lower portion" near a bottom becomes H3, and a film thickness of a film forming material 204b corresponding to a position between the "upper portion" and the "lower portion" becomes H2.

It has recently been required to deposit a film forming material on holes or trenches having a high aspect ratio. In this case, overhang is likely to occur, in which the diameter in the opening of the pattern 200 becomes smaller than that in the bottom due to the film forming processing. If a next film forming processing is performed in a state where the opening width of the trench or hole is narrowed by generation of overhang, the film forming material is unable to be sufficiently filled inside of the pattern, resulting in generation of a void (cavity).

Therefore, in consideration of a film forming condition including at least a film formation time in a first film forming processing and a film forming condition including at least a film formation time in a second film forming processing to be described later, the film forming material 204 is etched under an etching condition including at least an etching time (see FIG. 3C). For example, in the etching processing from the step of FIG. 3B to the step of FIG. 3C, the film forming material 204 is etched under an etching condition including an etching time t2. Accordingly, a film thickness of the film forming material 204a corresponding to the "upper portion" near an opening becomes H1', a film thickness of the film forming material 204c corresponding to the "lower portion" near a bottom becomes H3', and a film thickness of the film forming material 204b corresponding to the position between the "upper portion" and the "lower portion" becomes H2'.

Then, as illustrated in FIG. 3D, the film forming material 204 is deposited again under a predetermined film forming condition including a film formation time (e.g., a film formation time t3 in the film forming processing from the step of FIG. 3C to the step of FIG. 3D), thereby filling the pattern 200 with the film forming material 204.

Here, the film forming processing using a vertical substrate processing apparatus has already been studied widely in the related art. Therefore, a relationship between a film forming condition and a film formation amount depending on, for example, the kind of the base film 202, the kind of the film forming material 204, the diameter of the pattern 200, and the aspect ratio, has already been known. However, a strict adjustment of an etching amount (or an etching rate) using the vertical substrate processing apparatus has not been performed. The present inventors has found that, in the film forming processing and the etching processing using the vertical substrate processing apparatus 100, the film forming material 204 may be easily filled in a recess of the pattern 200 without any void in a short turn-around time (TAT) while minimizing a time or effort of a person, by adjusting the film formation amount and the etching amount at the same time using the control apparatus 132. More specifically, the control apparatus 132 calculates the optimal time distribution with respect to the film formation time t1 in the first film forming processing, the etching time t2 in the etching processing, and the film formation time t3 in the second film forming processing. Then, based on the time distribution, the control apparatus 132 controls the vertical substrate processing apparatus 100 to process the substrate. Therefore, it is found out that the film forming material 204 may be easily filled in the recess of the pattern 200 without any void in a short TAT.

Figure 4:
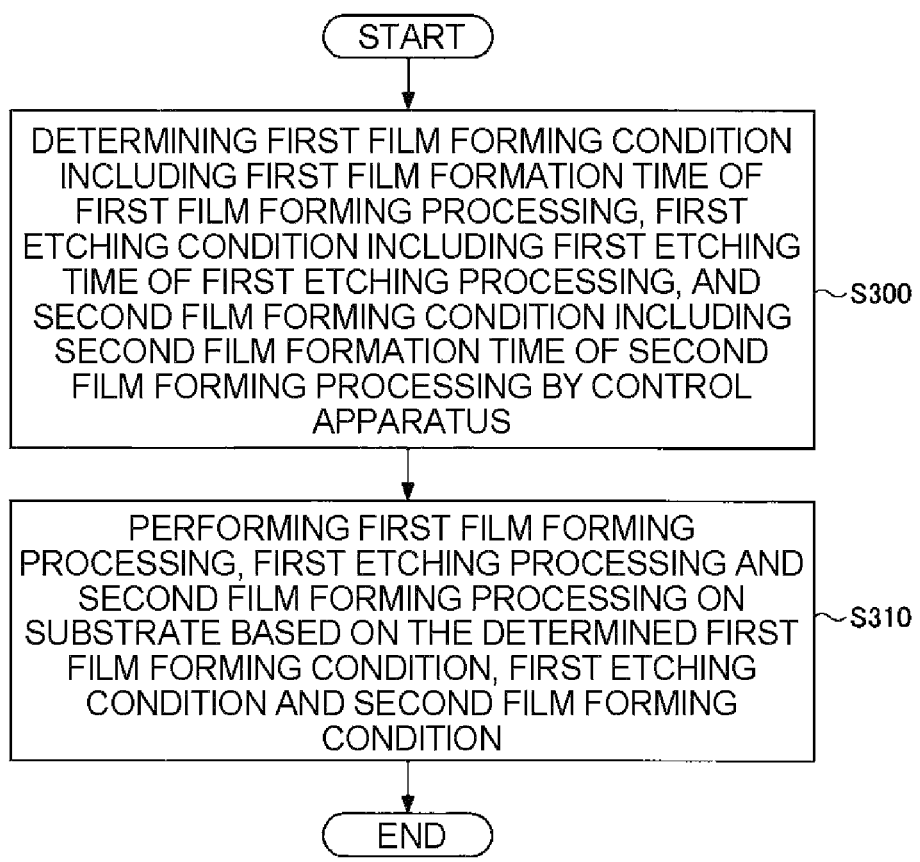
FIG. 4 is a flowchart illustrating an example of a substrate processing method according to the present exemplary embodiment.

FIG. 4 is a flowchart illustrating an example of the substrate processing method according to the present exemplary embodiment. According to the present exemplary embodiment, there is provided a substrate processing method of filling a recess of a predetermined uneven pattern formed on a substrate with a film forming material by performing a first film forming processing, a first etching processing and a second film forming processing on the substrate. The substrate processing method includes calculating a first film forming condition including a first film formation time of the first film forming processing, a first etching condition including a first etching time of the first etching processing, and a second film forming condition including a second film formation time of the second film forming processing by the control apparatus (S300) such that the film forming material is filled in the recess without any void after the second film forming processing; and performing the first film forming processing, the first etching processing and the second film forming processing on the substrate based on the calculated first film forming condition, first etching condition and second film forming condition (S310).

Meanwhile, as described above, the control apparatus 132 may be a single apparatus as it is, or may be assembled into the vertical substrate processing apparatus 100 as a control unit in the vertical substrate processing apparatus 100.

As control objects, from the viewpoint of adjusting the inter-plane film formation amount and etching amount of the plurality of wafers W, it is possible to select, for example, one wafer W each from every site corresponding to the zones of the heaters 128a to 128e among a plurality of wafers W placed in the wafer boat 126, making a total of five sheets of wafers W. Further, from the viewpoint of adjusting the in-plane film formation amount and etching amount of the wafer W, it is possible to select, for example, two sites, that is, a central portion and a peripheral portion of the wafer W, as control objects. Further, from the viewpoint of adjusting the film formation amount and etching amount in the depth direction of the pattern 200 of the wafer W, it is possible to select three sites, that is, the "upper portion" near the opening, the "lower portion" near the bottom, and the "middle portion" at any position between the upper portion and the lower portion in the depth direction of the pattern 200, as control objects. However, the present disclosure is not limited thereto.

As described above, in the example of FIGS. 3A to 3D, the process of filling the film forming material 204 by sequentially performing a film forming processing, an etching processing and a film forming processing, was described. However, the present disclosure is not limited thereto. For example, the film forming material 204 may be filled by repeating the film forming processing and the following etching processing once or more times, and performing the film forming processing again. In this case, the film forming condition including the film formation time in each film forming processing and the etching condition including the etching time in each etching processing are controlled by the control apparatus 132. That is, the film forming material 204 may be easily filled without any void in a short turn-around time (TAT) while minimizing a time or effort of a person, by adjusting the film formation amount and the etching amount at the same time using the control apparatus 132.

[Influence of Film Formation Time and Etching Time on Film Formation Amount and Etching Amount]

Next, description will be made on the reason that the film forming material 204 can be filled in the recess of the pattern 200 without any void by optimizing the film formation time and the etching time in the substrate processing method of the present exemplary embodiment. First, a relationship between the film formation time and the film formation amount and a relationship between the etching time and the etching amount will be described.

For example, as for the film forming material 204 in FIG. 3B, strictly speaking, the film formation rates and the etching rates of the film forming material 204a corresponding to the "upper portion", the film forming material 204b corresponding to the "middle portion", and the film forming material 204c corresponding to the "lower portion" in the depth direction of the pattern 200, depend on a film thickness distribution shape of the film forming material 204 which has already been formed. In general, however, the film formation rate (film formation amount) of the "upper portion" is greatly influenced by the film formation time, as compared with the film formation rates (film formation amounts) of the "middle portion" and the "lower portion". Further, in general, in the short term, the etching rate (etching amount) of the "upper portion" is more greatly influenced by the etching time, as compared with the etching rates (etching amounts) of the "middle portion" and the "lower portion". Therefore, the film forming material 204 may be filled in at least the recess of the pattern 200 without any void by selecting a condition such that the etching rate of the "upper portion" is larger than the etching rates of the "middle portion" and the "lower portion". At this time, a relationship between the film formation time of the film forming processing and the etching time of the etching processing, and the film formation amount and the etching amount in each of the upper portion, the middle portion and the lower portion, is modelled in advance. Based on this model, a relationship between the processing condition including a combination of the first film formation time, the etching time, and the second film formation time, and the film thickness of the film forming material 204, is modelled. Then, based on this model made previously, the control apparatus 132 calculates an optimal time distribution about the film formation time and the etching time for every desired process contents.

[Influence of Other Parameters on Film Formation Amount and Etching Amount]

Further, in the substrate processing method of the exemplary embodiment, the control apparatus 132 may be configured to calculate the optimal processing conditions even for processing conditions other than the time (the film formation time and the etching time).

The "processing conditions other than the time" includes, for example, a film formation temperature, a flow rate of the film forming gas, and a pressure during film forming (that is, a pressure in the processing chamber 102) in the film forming processing, and, for example, an etching temperature, a flow rate of the etching gas, and a pressure during etching (that is, a pressure in the processing chamber 102) in the etching processing. That is, the control apparatus 132 may be configured to calculate the optimal conditions for the processing conditions of the "temperature, the "flow rate of the processing gas" and the "pressure" in each processing.

The relationship between the film forming condition and the film formation amount in the film forming processing has been studied widely and well known. Accordingly, in the present specification, a relationship between the etching condition and the etching amount in the etching processing will be described. As described above, the etching condition which influences the etching amount, that is, a means for adjusting the etching amount by the control apparatus 132 may include, for example, a temperature of the wafer W during etching, a flow rate of the etching gas, and a pressure during etching.

For example, the etching amount of the whole etching processing may be adjusted by adjusting the temperature of the wafer W during etching. Further, the inter-plane uniformity of the etching amount may be enhanced by adjusting the temperature between the zones of the heaters 128a to 128e. Meanwhile, the temperature during etching may be constant or varied so as to cool or heat over time. The extent of the temperature change in the central portion of the wafer W is different from that of the peripheral portion of the wafer W. Specifically, since the peripheral portion of the wafer W is close to the heater 128, the peripheral portion is likely to be heated or cooled. Further, since the central portion of the wafer W is far from the heater 128, the central portion is difficult to be heated or cooled. Therefore, the in-plane etching amount of the wafer may be adjusted by performing an etching while changing the temperature.

In another example, the etching amount in the whole etching processing may be adjusted by changing the flow rate of the etching gas. Further, the inter-plane uniformity and the in-plane uniformity of the etching amount may be enhanced by adjusting the number or disposition of gas introduction units 106 and adjusting the flow rate of the etching gas in each gas introduction unit 106.

In still another example, the etching amount in the whole etching processing may be adjusted by adjusting the pressure during etching. Further, the adjustment of the pressure during etching is also effective as a means for enhancing the inter-plane uniformity and the in-plane uniformity of the etching amount.

Further, the etching amount may also be adjusted in the depth direction of the pattern 200 by adjusting the flow rate of the etching gas and the pressure during etching as described above.

As for the "upper portion" near the opening, the "lower portion" near the bottom, and the "middle portion" at any position between the upper portion and the lower portion in the depth direction of the pattern 200, for instance, it will be described which site the etching amount is changed by changing the etching condition as described above. For example, when the flow rate of the etching gas is changed, the influence on the etching amount in the "upper portion" is large, and the influence on the etching amount in the "middle portion" and the "lower portion" is relatively small. In addition, when the pressure during etching is changed, the influence on the change in etching amount in the "middle portion" and "lower portion" becomes larger as compared with the case of the flow rate of the etching gas as described above.

[Process Model]

The control apparatus 132 of the present exemplary embodiment optimizes the time distribution of the film formation time and the etching time based on the models stored in advance in the model storage unit 134. An exemplary embodiment of the process model stored in the model storage unit 134 of the control apparatus 132 of the present exemplary embodiment will described.

In an exemplary embodiment, the model storage unit 134 stores a processing time-film thickness model as a process model which expresses an influence of a processing time including a combination of a first supply time when the film forming gas is supplied in a (first) film forming processing, a second supply time when the etching gas is supplied in an etching processing, and a third supply time when the film forming gas is supplied in a (second) film forming processing, on the film thickness of the film forming material on the substrate.

This processing time-film thickness model may be fabricated by those skilled in the art using a film forming gas supply time-film formation amount model which expresses an influence of the supply time of the film forming gas on the film formation amount of the film forming material on the wafer, and an etching gas supply time-etching amount model which expresses an influence of the supply time of the etching gas on the etching amount of the film forming material on the wafer. Meanwhile, the film forming gas supply time-film formation amount models used in the first film forming processing and the second film forming processing may be the same as or different from each other. In a case of a process in which the film formation rates in the first film forming processing and the second film forming processing are approximately the same, the process may be configured to use the same model and absorb an error in a learning function as described below. Further, in a case of a process in which the film formation rates in the first film forming processing and the second film forming processing are considerably different from each other, the model may be fabricated in each process.

Further, the model storage unit 134 may store another process model for the film formation temperature, the flow rate of the film forming gas and the pressure during film forming, or another process model for the etching temperature, the flow rate of the etching gas and the pressure during etching.

In an exemplary embodiment, the model storage unit 134 may store: a wafer temperature-film formation amount model which expresses an influence of the temperature of the wafer W on the film formation amount of the film forming material; a film forming gas flow rate-film formation amount model which expresses an influence of the flow rate of the film forming gas on the film formation amount of the film forming material; and a film formation pressure-film formation amount model which expresses an influence of the pressure in the processing chamber 102 on the film formation amount of the film forming material. Further, in this case, the model storage unit stores a thermal model which expresses a relationship between the temperature of the wafer W in the processing chamber and a setting temperature of the heater 128, that is, an output of the power controller 130 of the heater 128. This thermal model may use a thermal model configured to estimate the temperature of the wafer W from, for example, an output of a temperature sensor (not illustrated) disposed on the inner wall of the inner tub 102a or the temperature of the monitor wafer W.

In another exemplary embodiment, the model storage unit 134 may store, as process models, a wafer temperature-etching amount model which expresses an influence of the temperature of the wafer W on the etching amount of the film forming material; an etching gas flow rate-etching amount model which expresses an influence of the flow rate of the etching gas on the etching amount of the film forming material; and a pressure-etching amount model which expresses an influence of the pressure in the processing chamber 102 on the etching amount of the film forming material.

By using these models, the control apparatus 132 may use parameters such as "temperature", "flow rate of the processing gas", and "pressure", in addition to the parameter of "time", as adjustment means. Therefore, the film thickness of the film forming material on the wafer W may be controlled more strictly.

The CPU 144 calculates the optimal processing time at least for each of the first film forming processing, the etching processing and the second film forming processing, based on the above-described process models stored in the model storage unit 134. Preferably, the CPU 144 calculates the film formation temperature and the etching temperature of the wafer W, the flow rate of the film forming gas and the flow rate of the etching gas, and the pressure in the processing chamber 102 during film forming and the pressure in the processing chamber 102 during etching. At this time, in calculating the respective processing conditions, an optimization algorithm, such as linear programming or quadratic programming is used to calculate a combination of the film forming time and the etching time satisfying the in-plane uniformity and the inter-plane uniformity of the wafer W based on the desired film thickness stored in the read process recipe.

The above-described process models or thermal model may also be considered about a case where the value of the default is not optimal depending on the process conditions or the state of the apparatus. Therefore, at least one of these models may be equipped with a learning function by adding an extended Kalman filter to software performing various calculations such that learning of the models is performed.

Descriptions will be made on a case of performing the substrate processing method according to the present exemplary embodiment.

First, a wafer W formed with a predetermined pattern is loaded into the processing chamber 102 in a state of being placed in the wafer boat 126. Then, if a desired film thickness of the film forming material 204 from the sidewall of the pattern 200 of the wafer W, temperature, gas flow rate, and pressure are not used as adjustment means, an operator inputs these processing conditions to the operation panel 148.

Further, when processing contents are input to the operation panel 148, the kind of the base film, the kind of the film forming material, and/or other information about the pattern 200 of the wafer W (e.g., diameter or aspect ratio of holes or trenches) may be input.

The CPU 144 determines whether there is input or not. If there is input, the CPU 144 reads out a film forming processing recipe and an etching processing recipe in response to the input instruction contents from the recipe storage unit 136.

Next, processing conditions including a film formation time for the first film forming processing, an etching time for the etching processing and a film formation time for the second film forming processing are calculated from the process models stored in the model storage unit 134, and the recipe is updated. The processing conditions are calculated using an optimization algorithm, such as linear programming or quadratic programming (see S300 in FIG. 4).

Next, the CPU 144 sets the temperature in the processing chamber 102 to a predetermined film formation temperature by the heater 128, and sets the pressure in the processing chamber 102 to a predetermined film formation pressure by the opening variable valve 114, based on the determined recipe. Then, according to the recipe, the CPU 144 supplies a film forming gas in a predetermined amount to the processing chamber 102 to perform the first film forming processing.

After a lapse of the determined film forming processing time for the first film forming processing, the supply of the film forming gas is stopped. Then, the CPU 144 sets the temperature in the processing chamber 102 to a predetermined etching temperature by the heater 128, and sets the pressure in the processing chamber 102 to a predetermined etching pressure by the opening variable valve 114, based on the recipe. Then, according to the recipe, the CPU 144 supplies an etching gas in a predetermined amount to the processing chamber 102 to perform the etching processing.

After a lapse of the determined etching processing time for the etching processing, the supply of the etching gas is stopped. Then, the CPU 144 sets the temperature in the processing chamber 102 to a predetermined film formation temperature by the heater 128, and sets the pressure in the processing chamber 102 to a predetermined film formation pressure by the opening variable valve 114, based on the recipe. Then, according to the recipe, the CPU 144 supplies a film forming gas in a predetermined amount to the processing chamber 102 to fill the pattern 200 with the film forming material 204.

After a lapse of the determined film forming processing time for the second film forming processing, the supply of the film forming gas is stopped and the processing is completed (see S310 in FIG. 4).

After the completion of the etching processing, the wafer W is unloaded. And, a determining processing may be performed, in which at least one wafer W is taken out from the wafers W placed in the wafer boat 126 and it is determined whether or not there is any problem with the film thickness of the film forming material.

The CPU 144 may store the calculated processing conditions as processing conditions for the next processing into the RAM 140, and update the recipe. Further, an operator may use the operation panel 148 to update the recipe by setting the calculated processing conditions as processing conditions for the next film forming processing.

As described above, the vertical substrate processing apparatus and the substrate processing method according to the present exemplary embodiment may process a plurality of wafers W simultaneously in one batch. Further, the film formation amount and the etching amount may be adjusted simultaneously by calculating the optimal time distribution of the film forming processing and the etching processing by the control apparatus 132. Accordingly, the film forming material 204 may be easily filled in a recess of the pattern 200 without any void in a short TAT while minimizing a time or effort of a person.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A substrate processing method of filling a recess of a predetermined uneven pattern formed on a substrate with a film forming material by performing a first film forming processing, a first etching processing and a second film forming processing on the substrate, using a vertical substrate processing apparatus, the method comprising:

identifying a first position near an opening of the recess, a second position near a bottom of the recess, and a third position between the first position and the second position in a depth direction of the recess of the predetermined uneven pattern;

generating a first model of a relationship between a first film forming condition including a first film formation time of the first film forming processing and a film formation amount, a relationship between a first etching condition including a first etching time of the first etching processing and an etching amount, and a relationship between a second film forming condition including a second film formation time of the second film forming processing and a film formation amount in advance;

generating, based on the first model, a second model of a relationship between a combination of the first film formation time, the first etching time, and the second film formation time and a film thickness of the film forming material in each of the first position, the second position, and the third position in advance;

calculating, by a control apparatus, an optimal time distribution of the first film formation time, the first etching time, and the second film formation time to be within a turn-around time by simultaneously adjusting each of the film formation amount of the first film forming processing, the etching amount of the first etching processing and the film formation amount of the second film forming processing based on the second model generated in advance such that an etching rate at the first position is larger than an etching rate at the second position and an etching rate at the third position; and after the calculating the optimal time distribution, sequentially performing the first film forming processing, the first etching processing and the second film forming processing on the substrate based on the optimal time distribution thereby filling the recess with the film forming material while suppressing voids in the recess.

2. The substrate processing method of claim 1, wherein the first film forming condition includes a film formation temperature, a flow rate of the film forming gas, and a pressure in the processing container, the first etching condition includes an etching temperature, a flow rate of the etching gas, and a pressure in the processing container, and the second film forming condition includes a film formation temperature, a flow rate of the film forming gas, and a pressure in the processing container.

3. A substrate processing method of filling a recess of a predetermined uneven pattern formed on a substrate with a film forming material by performing a first film forming processing, a first etching processing and a second film forming processing on the substrate, using a vertical substrate processing apparatus, the method comprising:

identifying a first position near an opening of the recess, a second position near a bottom of the recess, and a third position between the first position and the second position in a depth direction of the recess of the predetermined uneven pattern;

generating a first model of a relationship between a first film forming condition including a first film formation time of the first film forming processing and a film formation amount, a relationship between a first etching condition including a first etching time of the first etching processing and an etching amount, and a relationship between a second film forming condition including a second film formation time of the second film forming processing in advance;

generating, based on the first model, a second model of a relationship between a combination of the first film formation time, the first etching time, and the second film formation time and a film thickness of the film forming material in each of the first position, the second position, and the third position in advance;

calculating, by the control apparatus, an optimal time distribution of a the first film formation time, the first etching time, and the second film formation time to be within a turn-around time by simultaneously adjusting each of the film formation amount of the first film forming processing, the etching amount of the first etching processing and the film formation amount of the second film forming processing based on the second model generated in advance such that an etching rate at the first position is larger than an etching rate at the second position and an etching rate at the third position; and after the calculating the optimal time distribution, sequentially performing the first film forming processing and the first etching processing for a predetermined of times based on the first film forming condition and the first etching condition with the optimal time distribution calculated at the calculating;

after the sequentially performing the first film forming processing and the first etching processing for a predetermined of times, performing the second film forming processing on the substrate based on the second film forming condition calculated at the calculating thereby filling the recess with the film forming material while suppressing voids in the recess, wherein a first etching amount of the first etching processing is adjusted together with a first film formation amount of the first film forming processing and a second film formation amount of the second film forming processing using the control apparatus.

* * * * *